(12) United States Patent
Li et al.

(10) Patent No.: US 7,235,989 B2
(45) Date of Patent: Jun. 26, 2007

(54) ELECTRICAL TEST DEVICE HAVING ISOLATION SLOT

(75) Inventors: Pao-Nan Li, Kaoshiung (TW); Chih-Wei Tsai, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/233,035

(22) Filed: Sep. 23, 2005

(65) Prior Publication Data
US 2006/0087333 A1  Apr. 27, 2006

(30) Foreign Application Priority Data
Oct. 22, 2004  (TW) .............. 93132282 A

(51) Int. Cl.
*G01R 31/02* (2006.01)
(52) U.S. Cl. .................................. 324/754
(58) Field of Classification Search .......... None
See application file for complete search history.

(56) References Cited

U.S. PATENT DOCUMENTS

| | | | | |
|---|---|---|---|---|
| 4,534,824 A | * | 8/1985 | Chen | 438/421 |
| 4,621,414 A | * | 11/1986 | Iranmanesh | 438/430 |
| 4,626,317 A | * | 12/1986 | Bonn | 438/432 |
| 5,561,377 A | * | 10/1996 | Strid et al. | 324/754 |
| 6,239,385 B1 | * | 5/2001 | Schwiebert et al. | 439/63 |
| 6,388,208 B1 | * | 5/2002 | Kiani et al. | 257/774 |
| 6,731,189 B2 | * | 5/2004 | Puzella et al. | 257/E21.585 |
| 6,937,039 B2 | * | 8/2005 | Barr et al. | 324/754 |

FOREIGN PATENT DOCUMENTS

JP           04196461 A   *  7/1992

* cited by examiner

*Primary Examiner*—Jermele Hollington
(74) *Attorney, Agent, or Firm*—Volentine & Whitt, P.L.L.C.

(57) ABSTRACT

An electrical test device including a substrate and a plurality of test pads. The test pads are disposed on a second surface of the substrate. Each test pad has a test hole, and first and second isolation slots. The first isolation slot is disposed on the periphery of the test hole, and defines a signal region for connecting a signal terminal of a test probe. The second isolation slot is disposed on the periphery of the first isolation slot, and a ground region is defined between the first and second isolation slots. The ground region is used for connecting a ground terminal of the test probe. The test pad can match with the test probe so that the test probe can connect to the test pad for providing signal to the test probe. The electrical test device can easily measure the real electrical characteristic of the signal from the substrate.

8 Claims, 4 Drawing Sheets

ELECTRICAL TEST DEVICE HAVING ISOLATION SLOT

BACKGROUND OF THE INVENTION

1. Field of the Invention

The invention relates to an electrical test device, particularly to an electrical test device having isolation slot.

2. Description of the Related Art

Referring to FIG. 1, a conventional electrical test board 10 comprises a substrate 11 and a plurality of test pads 12. The substrate 11 has a first surface 111 and a second surface 112. The second surface 112 is corresponding to the first surface 111, and the second surface 112 is usually the back of the electrical test board 11. Each test pad 12 has a test hole 121 and an isolation slot 123. The isolation slot 123 is disposed on the periphery of the test hole 121, and defines a signal region 122. The signal region 122 is used for connecting to a signal terminal 151 of a test probe 15. The test hole 121 electrically connects to the signal region 122; therefore, the corresponding signal can be provided to the signal terminal 151 of the test probe 15.

The region outside the isolation slot 123 of the second surface 112 is a ground region, and the ground region is used for connecting a ground terminal 152 of the test probe 15. The isolation slot 123 is used to separate the signal region 122 and the ground region (i.e. the second surface 112) so that the signal region 122 and the ground region are isolated. The conventional electrical test board 10 must match with the test probe 15, and the test probe 15 is an expensive high frequency test probe. In addition, it is inconvenient to connect corresponding points for electrical test by using the conventional electrical test board 10 and the test probe 15.

Referring to FIG. 2, another conventional electrical test board 20 comprises a substrate 21 and a plurality of test pads 22. Similarly, each test pad 22 has a test hole 221, a signal region 222 and an isolation slot 223. The conventional electrical test board 20 further comprises a transmission line 24 and an auxiliary probe 25. The transmission line 24 is used for electrically connecting the signal region 222 and the auxiliary probe 25 so that the test probe 26 can receive the corresponding signal from the signal region 222 after connecting to the auxiliary probe 25.

However, actual test point (signal region 222) of the conventional test structure must further connect to the transmission line 24 and the auxiliary probe 25 for test so that the real electrical characteristics of the signal region 222 cannot be directly tested easily.

Consequently, there is an existing need for electrical test board to solve the above-mentioned problems.

SUMMARY OF THE INVENTION

One objective of the present invention is to provide an electrical test device having isolation slot. The electrical test device comprises a substrate and a plurality of test pads. The test pads are disposed on a second surface of the substrate. Each test pad has a test hole, a first isolation slot and a second isolation slot. The first isolation slot is disposed on the periphery of the test hole, and defines a signal region for connecting a signal terminal of a test probe. The second isolation slot is disposed on the periphery of the first isolation slot, and a ground region is defined between the first isolation slot and the second isolation slot. The ground region is used for connecting a ground terminal of the test probe.

The test pad of the invention can match with the test probe so that the test probe can connect to the test pad for providing signal to the test probe. Therefore, the electrical test device can be utilized to easily measure the real electrical characteristic of the signal from the substrate.

DETAILED DESCRIPTION OF THE INVENTION

Figure 1:
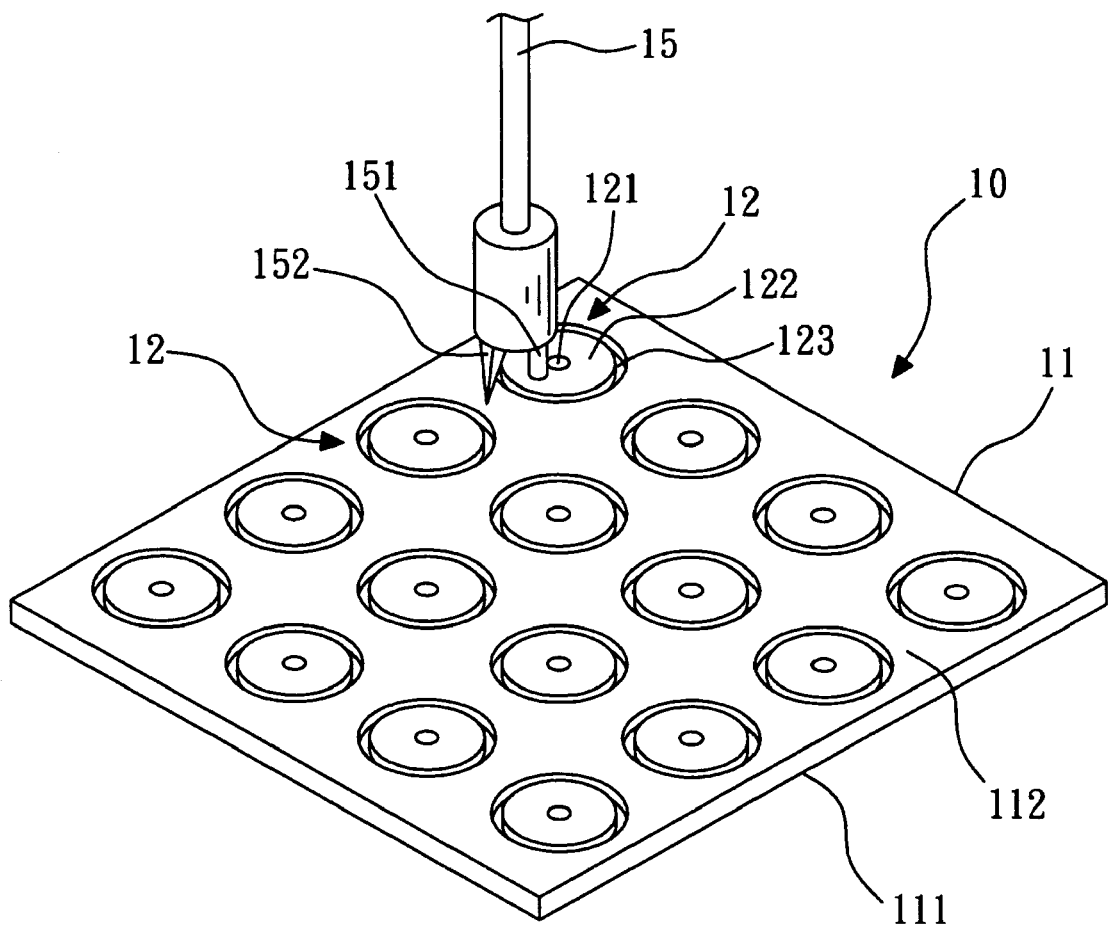
FIG. 1 shows a conventional electrical test board connecting with a test probe.
Figure 2:
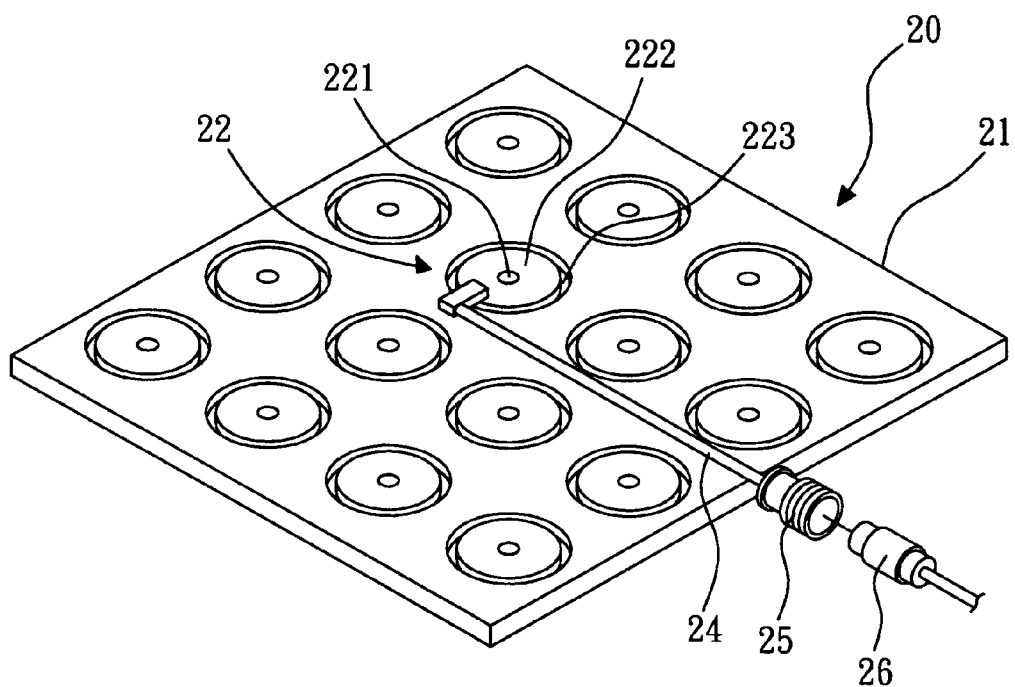
FIG. 2 shows another conventional electrical test board connecting with a test probe.
Figure 3:
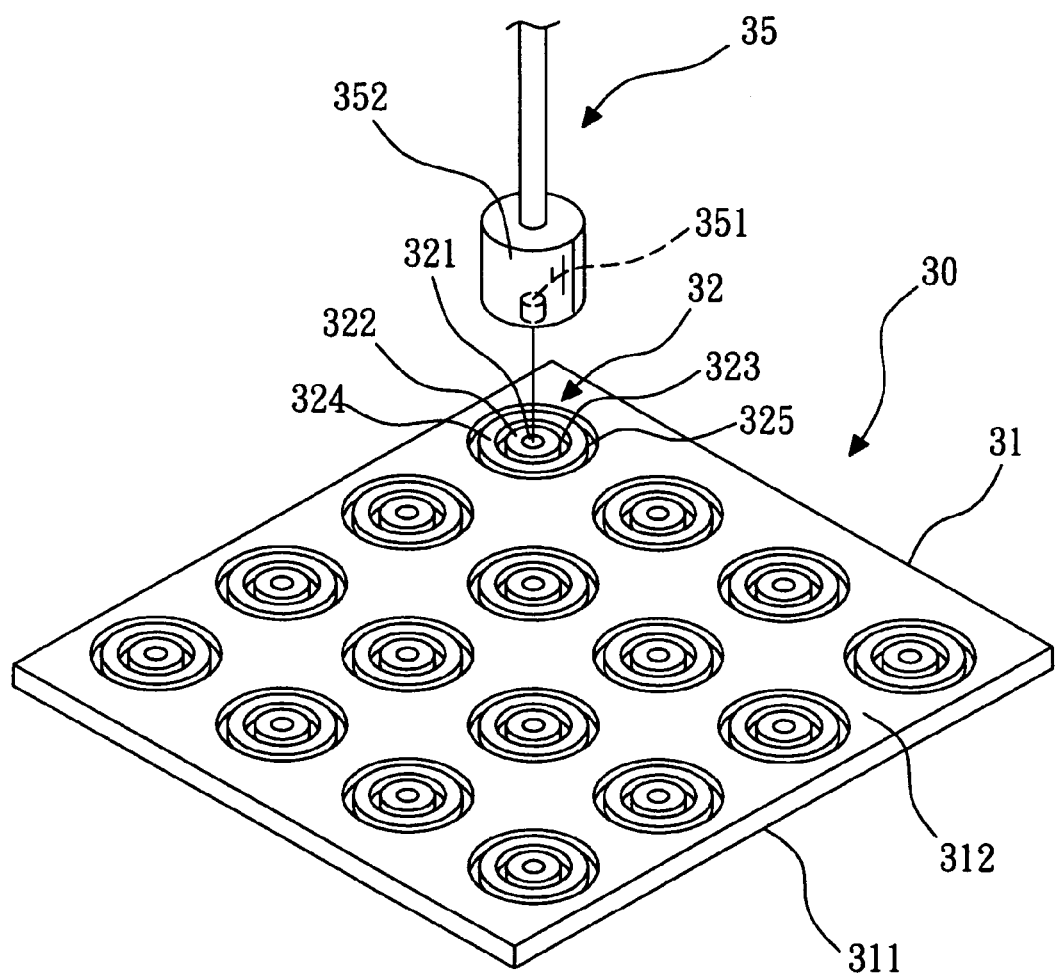
FIG. 3 shows an electrical test device of the present invention.

Referring to FIG. 3, it shows the structure of the electrical test device 30 of the present invention. The electrical test device 30 of the present invention comprises a substrate 31 and a plurality of test pads 32. The substrate 31 has a first surface 311 and a second surface 312. The second surface 312 is corresponding to the first surface 311, and the second surface 312 is usually the back of the electrical test device 30.

The test pads 32 are disposed on the second surface 312 of the substrate 31. Each test pads 32 has a test hole 321, a first isolation slot 323 and a second isolation slot 325. The first isolation slot 323 is disposed on the periphery of the test hole 321, and defines a signal region 322 in the first isolation slot 323. The annular signal region comprises the test hole 321 and the signal region 322, and the test hole 321 electrically connects with the annular signal region 322 for connecting a signal terminal 351 of a test probe 35.

Figure 4:
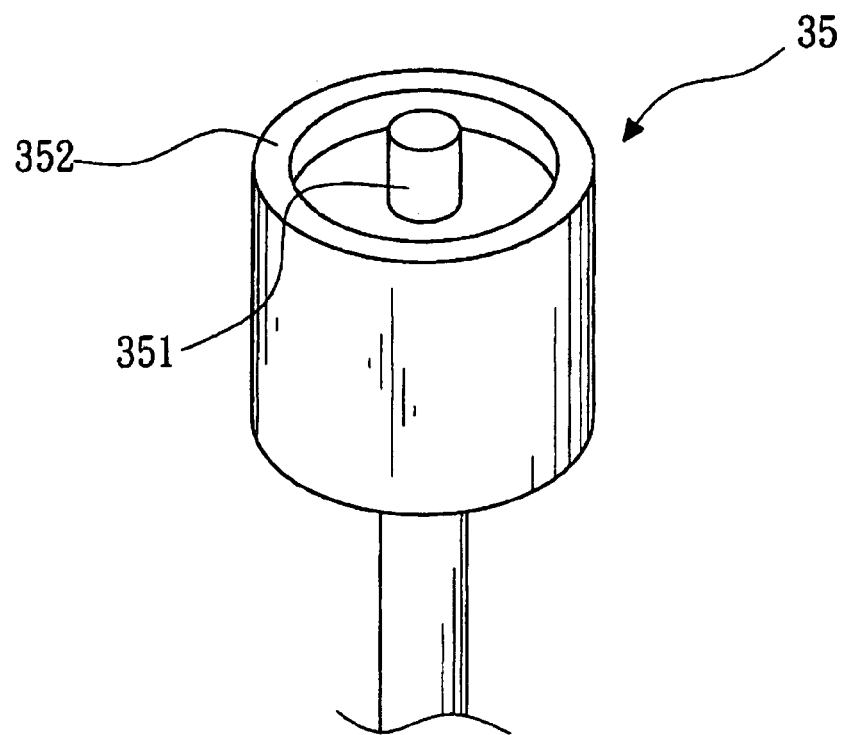
FIG. 4 shows a test probe.
Figure 5:
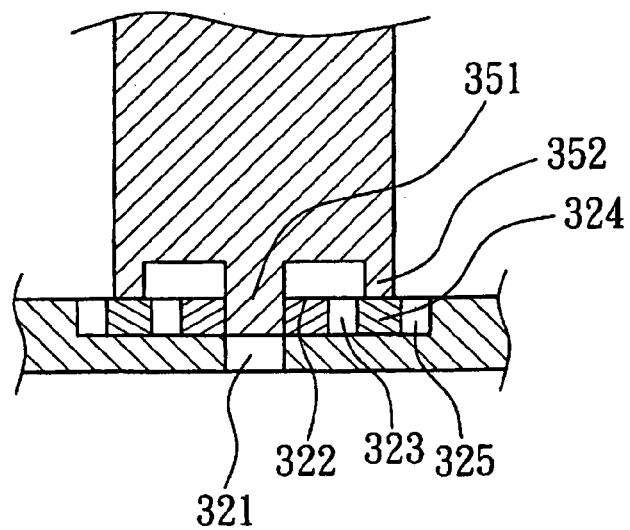
FIG. 5 shows a sectional view of connecting the electrical test board of the present invention and the test probe.

Referring to FIG. 4, the test probe 35 comprises a signal terminal 351 and ground terminal 352. The signal terminal 351 of the test probe 35 is disposed on center portion, and the ground terminal 352 is annular. Referring to FIG. 5, perfectly, the signal terminal 351 of the test probe 35 is precisely disposed in the test hole 321 and electrically connects with the test hole 321 so as to provide corresponding signals to the test probe 35. Since the annular signal region 322 electrically connects with the test hole 321, it is not necessary to dispose the signal terminal 351 of the test probe 35 in the test hole 32. Therefore, the signal terminal 351 of the test probe 35 can also contact with the annular signal region 322 and electrically connects with the annular signal region 322 so that the corresponding signal can also be obtained. In other words, the corresponding signal can be obtained in any region of the first isolation slot 323.

Referring to FIG. 3 and FIG. 5, the second isolation slot 325 is disposed on the periphery of the first isolation slot 323, and a ground region 324 is defined between the first isolation slot 323 and the second isolation slot 325. The ground region 324 is a closed ring, and it can precisely match with the ground terminal 352 of the test probe 35 so that the ground region 324 electrically connects with the ground terminal 352.

Perfectly, the first isolation slot 323 and the second isolation slot 325 are closed rings but not limited as closed rings. The first isolation slot 323 is used to separate the signal region and the ground region 324. The first isolation slot 323 and the second isolation slot 325 are concave corresponding to the annular signal region 322 and the ground region 324.

The first isolation slot 323 is annular and has a first diameter. The second isolation slot 325 is annular too and has a second diameter. The second diameter is larger than the first diameter. The ground terminal 352 of the test probe 35 is annular and has a third diameter, and the third diameter is between the first diameter and the second diameter. That is to say, the ground terminal 352 of the test probe 35 matches with the ground region 324 so that the ground region 324 electrically connects with the ground terminal 352.

The test pads 32 of the electrical test device 30 of the present invention precisely match with the test probe 35 (for example, SMA test probe) so that the test probe 35 can directly connect to the test pads 32 and obtains signal. Therefore, there is no need to use a transmission line or an additional auxiliary probe and expensive high frequency test probe. By utilizing the electrical test device 30 of the present invention, the real characteristics of the corresponding signal of the substrate can be easily measured.

While the embodiment of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. An electrical test device having isolation slots comprising:
   a substrate, having a first surface and a second surface; and
   a plurality of test pads, disposed on the second surface of the substrate, each test pad having a test hole, a first isolation slot and a second isolation slot, the first isolation slot disposed on a periphery of the test hole, and defining a signal region for connecting a signal terminal of a test probe, the second isolation slot disposed on a periphery of the first isolation slot, a ground region defined between the first isolation slot and the second isolation slot, and the ground region for connecting a ground terminal of the test probe.

2. The electrical test device according to claim 1, wherein the first isolation slot and the second isolation slot are closed rings.

3. The electrical test device according to claim 1, wherein the signal region comprises the test hole and an annular signal region, and the test hole electrically connects with the annular signal region.

4. The electrical test device according to claim 1, wherein the first isolation slot is used to separate the signal region and the ground region.

5. The electrical test device according to claim 1, wherein the first isolation slot is annular and has a first diameter; the second isolation slot is annular and has a second diameter; the ground terminal of the test probe is annular and has a third diameter; the second diameter is larger than the first diameter; and the third diameter is between the first diameter and the second diameter.

6. The electrical test device according to claim 1, wherein the first isolation slot and the second isolation slot are concave corresponding to the signal region and the ground region.

7. The electrical test device according to claim 1, wherein the signal terminal of the test probe is disposed in the test hole and electrically connects with the test hole.

8. The electrical test device according to claim 1, wherein the test probe comprises the signal terminal and the ground terminal,
   wherein the signal terminal of the test probe is disposed on a center of the test probe, and
   wherein the ground terminal is annular and disposed around the signal terminal of the test probe.

* * * * *